United States Patent [19]

Pucci

[11] 4,311,753

[45] Jan. 19, 1982

[54] CURING AGENT FOR EPOXY RESIN LAMINATING COMPOSITIONS COMPRISING A MIXTURE OF DICYANDIAMIDE AND A TETRA-ALKYLGUANIDINE

[75] Inventor: Donald G. Pucci, West Lafayette, Ohio

[73] Assignee: General Electric Company, Coshocton, Ohio

[21] Appl. No.: 58,193

[22] Filed: Jul. 17, 1979

[51] Int. Cl.³ .................. B32B 17/04; C08G 59/18; C08G 59/38; C08G 59/46; C08G 59/56
[52] U.S. Cl. ........................... 428/251; 260/33.2 EP; 428/273; 428/285; 428/290; 428/901; 525/524; 528/103
[58] Field of Search .............. 428/251, 273, 285, 290, 428/901; 525/524; 528/103; 260/33.2 EP

[56] References Cited

U.S. PATENT DOCUMENTS 2,637,715  5/1953  Ott.
3,391,113  7/1968  Lopez et al..
3,523,037  8/1970  Chellis et al..
3,600,263  8/1971  Lapitz.
3,741,858  6/1973  Fujiwara et al..

*Primary Examiner*—James C. Cannon
*Attorney, Agent, or Firm*—Hedman, Casella, Gibson & Costigan

[57] ABSTRACT

Curing agents for mixed di- and tetra-functional epoxy resin laminating compositions comprise a mixture of dicyandiamide and from 0.01 to 1 parts per part of dicyandiamide of a tetraalkylguanidine. B-staged prepregs for cores and for multi-layer bonding sheets having superior storage stability and adapted to provide reproducible multilayer laminates are made from laminating compositions employing the new curing agent combination.

4 Claims, No Drawings

CURING AGENT FOR EPOXY RESIN LAMINATING COMPOSITIONS COMPRISING A MIXTURE OF DICYANDIAMIDE AND A TETRA-ALKYLGUANIDINE

The present invention relates to a curing composition for epoxy resins and to its use in preparing impregnated sheets for producing laminates for use in printed circuits, and the like.

BACKGROUND OF THE INVENTION

Glass fiber reinforced laminates prepared from cured epoxy resins are well known in the art. The use of difunctional brominated epoxy resins produces laminates having self-extinguishing properties. See, for example, Lapitz, Jr., U.S. Pat. No. 3,600,263 and Fujiwara et al, U.S. Pat. No. 3,741,858, the disclosures of which are incorporated herein by reference. A disadvantage noted is the tendency of such laminates to be swelled or attacked by solvents during fabrication of printed circuits. Solvent resistance has been improved by mixing the difunctional brominated epoxys with tetrafunctional epoxys prior to impregnation of the glass fibers; see Chellis, U.S. Pat. No. 3,523,037, the disclosure of which is incorporated herein by reference. In his mixed epoxy laminating systems Chellis uses a curing system comprising dicyandiamide catalyzed with a tertiary amine. It has been found that such a curing system suffers the disadvantage of producing B-staged saturated sheets (prepregs) which are not particularly consistent within a lot or from lot-to-lot. The prepregs produce laminates of the single and multilayer type which are not as consistent and reproducible in their properties as would be desired Lopez et al, U.S. Pat. No. 3,391,113, the disclosure of which is incorporated herein by reference, disclose that di-functional epoxy resin compositions can be rapidly cured at lower than expected temperatures with a curing system comprising curing amounts of dicyandiamide and from 0.01 to 1 part by weight of dicyandiamide of a tetramethyl- or tetraethyl-guanidine. The system is stated in Col. 2, lines 15-16, to have a relatively low shelf life. Lopex et al. have to overcome this and extended shelf life by adding acids such as benzoic acid in substantial quantities.

It has now been discovered that superior laminating compositions and prepregs can be made by mixing di- and tetra-functional epoxides and curing them with a system comprising dicyandiamide and a tetraalkylguanidine. Unexpectedly, there is no need to introduce stabilizing additives to overcome the expected low shelf life because stable prepregs are produced in spite of the teachings in Lopez et al, when instead of difunctional epoxy resins, a mixture of di- and tetra-functional epoxy resins is used. In addition, it is preferred to use a difunctional epoxy resin with a lower molecular weight than that employed by Chellis thereby obtaining more consistent and more reproducible prepreg and bonding sheet materials. The present invention uses one with an epoxy equivalent weight (EEW) of 370-430, whereas Chellis states that an EEW or 455 to 500 is critical.

DESCRIPTION OF THE INVENTION

According to the present invention, there are provided curing agents for an epoxy resin mixture of (i) from 70 to 90 parts of a brominated epoxy resin comprising the reaction product of tetrabromobisphenol-A and epichlorohydrin having an epoxide equivalent weight in the range of 370-430 and a bromide content in the range of 15-22% and (ii) from 10 to 30 parts of a tetrafunctional epoxy resin comprising the reaction product of tetra-bis(hydroxyphenyl)ethane having an epoxide equivalent weight in the range of 210-240, said curing agent consisting essentially of a mixture of dicyandiamide and from 0.01 to 1.0 parts per part of said dicyandiamide of a tetraalkylguanidine.

Among the features of the invention are an epoxy resin composition for preparing B-stages storage-stable, reproducible prepregs and multi-layer bonding sheets adapted to produce flame retardant laminates, said composition comprising (a) an epoxy resin mixture of (i) from 70 to 90 parts of a brominated epoxy resin comprising the reaction product of tetrabromobisphenol-A and epichlorohydrin having an epoxide equivalent weight in the range of 370-430 and a bromine content in the range of 15-22% and (ii) from 10 to 30 parts of a tetrafunctional epoxy resin comprising the reaction product of tetra-bis(hydroxyphenyl)ethane having an epoxide equivalent weight in the range of 210-240;

(b) an effective amount of dicyandiamide as a curing agent;

(c) from about 0.01 to 1.0 parts per part of said dicyandiamide of a tetraalkylguanidine as a catalyst; and (d) a suitable solvent.

Also contemplated by the invention are, as an article of manufacture, a glass fabric impregnated with an epoxy resin composition comprising:

(a) an epoxy resin mixture of (i) from 70 to 90 parts of a brominated epoxy resin comprising the reaction product of tetrabromobisphenol-A and epichlorohydrin having an epoxide equivalent weight in the range of 370-430 and a bromine content in the range of 15-22% and (ii) from 10 to 30 parts of a tetrafunctional epoxy resin comprising the reaction product of tetra-bis(hydroxyphenyl)ethane having an epoxide equivalent weight in the range of 210-240;

(b) an effective amount of dicyandiamide as a curing agent;

(c) from about 0.01 to 1.0 parts per part of said dicyandiamide of a tetraalkylguanidine.

The brominated epoxy resin component is a polyglycidyl ether of tetrabromobisphenol-A or a mixture of tetrabromobisphenol-A and bisphenol-A. It has a functionality of about 2, a bromine content of 15-22%, preferably 17-20%, and has an epoxide equivalent (solids) of 370-430. A procedure for preparing a suitable brominated epoxy resin will be exemplified hereinafter.

The tetrafunctional epoxy resin component is a polyglicydyl ether of tetraphenylethane, and is prepared from tetrabis(hydroxyphenyl)ethane and epichlorohydrin. This epoxy resin has an average functionality of about 4 and an epoxide equivalent weight of about 210 to 240. It is described in Encyclopedia of Polymer Science and Technology, John Wiley and Sons, New York, N. Y., Vol. 6, page 214, formula (13), incorporated herein by reference and in the above-mentioned Chellis patent. Shell Chemical supplies a suitable resin under the trade name Epon 1031; and Union Carbide under the tradename Bakelite ERR-0153.

Dicyandiamide component (b) is well known as a latent curing agent for epoxy resins; See U.S. Pat. No. 2,637,715, which is incorporated herein by reference, and the above-mentioned Lopez et al patent. This is commercially available from American Cyanamide Co.

The term "tetraalkylguanidine" is intended to include guanidines bearing alkyl groups, independently, of from 1 to 6 carbon atoms. As in U.S. Pat. No. 3,391,113, the preferred tetraalkyl guanidines are tetraethylguanidine and tetramethylguanidine. These are commercially available from American Cyanamide Co.

Any conventional solvent will be suitable for the present impregnants. See, for example, the illustrative patents cited above. Preferably, the solvents will comprise aromatic hydrocarbons, e.g., toluene; alkylene glycol mono- or di-ethers or -esters, e.g., methyl cellosolve, di(lower alkyl $C_1$–$C_6$) ketones, e.g., acetone, methyl ethyl ketone, alkly formamides, e.g., dimethyl formamide, mixtures of any of the foregoing, and the like.

The relative proportions of components making up the compositions for impregnating glass cloth, glass paper, glass mat, and the like, can vary widely. For example, for each part of resin solids, one can use from 1 to about 10, and preferably from about 2 to 5 parts of dicyandiamide, from about 0.01 to about 1 part of tetraalkyl guanidine, preferably from 0.02 to 0.1 parts; and sufficient solvent to provide a concentration of resin components giving the proper resin loading. The amount of solvent is easily determinable by those skilled in the art; and will be exemplified hereinafter.

In carrying out the invention to produce a B-stage prepreg, the glass web is passed through the varnish comprising the resins and solvent. The impregnating apparatus may be of any commercial type such as a two zone treater of the dip-squeeze type. Typical treating conditions include a squeeze roll setting of about 0.010 inch, a wet zone temperature of about 270°–300° F., a dry zone temperature of about 310°–330° F., and a web speed of 100–200 inches per minute. Dwell time in the oven is about 3–7 minutes. The resin varnish is usually about 40–70% resin solids. The above treating conditions result in a resin composition content in the treated glass web of about 40–70% by weight based on the glass weight. The impregnated, B-staged and dried glass cloth is cut to the desired size and stacked to obtain the desired laminate thickness. To make multilayers, bonding sheets can be used. Foil cladding, e.g., copper foil, can also be included in conventional lay-up procedures.

To consolidate the stack or stacks into unitary laminates, the pressures of about 200–2000 psi and temperatures of about 130° C.–175° C. are employed depending on the press cycle used and the desired density of the laminate. The pressing cycle may vary from a few minutes up to about 75 minutes depending on the laminate thickness and the number of stocks pressed in each sheet opening. The stacked sheets are loaded into a cold press, consolidated under the above pressing conditions, and unloaded when cooled to about 150° F.

DESCRIPTION OF THE PREFERRED EMBODIMENTS

The invention will be further particularized by the following examples. It is to be understood that the Examples are given solely for the purpose of illustration.

EXAMPLE 1

The following resin varnish is applied to woven glass fabric in a two zone treater. After being dried the prepreg contains about 60% by weight of the impregnant.

| Material | Parts by Weight |
| --- | --- |
| Difunctional brominated epoxy resin[a] | 100 |
| Tetrafunctional epoxy resin[b] | 22.0 |
| Dicyandiamide | 2.7 |
| Tetramethylguanidine | 0.1 |
| Solvent methyl cellosolve | 13.6 |
| Solvent dimethyl formamide | 9.0 |
| Solvent acetone | 3.4 |

[a]Epoxide equivalent (solids) 370–430; bromine content 17–20%;
[b]Epoxide equivalent 200–240; 80% solids in methyl ethyl (ketone; Shell EPON 1031.

The brominated epoxy resin component is prepared by the following procedure:

Equal parts by weight of a bisphenol-A-epichlorohydrin reaction product and tetrabromobisphenol-A are heated to above 180° C. until homogeneous and reacted, then to the hot liquid is added enough of a blend of methyl cellusolve and acetone to cool it to about 75° C. Then a mixture comprising 1 part of tetrabromobisphenol-A to 14 parts of bisphenol-A-epichlorohydrin-reaction product to 6 parts of acetone is added. Final solids content is about 70% by weight.

The treated and dried prepreg is cut and is storage stable for a year or more.

Laminates prepared therefrom are flame-resistant and have remarkably reproducible properties.

EXAMPLE 2

The general procedure of Example 1 is repeated with the following resin varnish:

| Material | Parts by Weight |
| --- | --- |
| Difunctional brominated epoxy resin[a] | 100 |
| Tetrafunctional epoxy resin[b] | 22.0 |
| Dicyandiamide | 3.0 |
| Tetramethylguanidine | 0.2 |
| Solvent methyl cellosolve | 14.7 |
| Solvent dimethyl cellosolve | 9.7 |
| Solvent acetone | 3.4 |

[a,b]See footnotes to Table 1

The treated and dried prepreg is storage stable.

Laminates therefrom are flame-resistant and have remarkably reproducible properties.

EXAMPLE 3

Using the formulation described in Example 2, a study of consistency and reproducibility of varnishes and B-stage materials is carried out by comparing 0.2 parts by weight tetramethylguanidine versus 0.2 parts by weight benzyldimethylamine, an example of a tertiary amine catalyst used in the prior art (Chellis, U.S. Pat. No. 3,523,037). The tetramethylguanidine catalyst is found to provide more consistent and more reproducible varnish than the benzyldimethylamine catalyst does. For the benzyldimethylamine catalyzed varnish, the gel time at 170° C. changes from 600 to 200 seconds during the first 18 hours after mixing. On the other hand the tetramethylguanidine varnish exhibits a constant gel time of 200 seconds at 170° C. during the same 18 hour period, which is typical of time required to manufacture B-staged prepreg or bonding sheet. The tetramethylguanidine catalyzed varnish is also more reproducible when additional varnishes are made and measured after 18 hours, having gel times of 180, 200, 180 and 190 seconds. Typical values for the benzyldimethylamine catalyzed varnishes are 300, 240, 180, and 280 seconds.

B-staged bonding sheets for the manufacture of multilayer are found to be more consistent when using tetramethylguanidine than when using benzyldimethylamine. Gel times at 170° C. are measured during an 18 hour period of manufacture (one lot). The tetramethylguanidine materials exhibits gel times ranging 120–130 seconds whereas the benzyldimethylamine materials exhibit a broad range of 120–400 seconds. This improved within-lot consistency is also demonstrated by laminating multilayers with B-stage from the beginning, middle, and end of a lot. The tetramethylguanidine catalyzed B-stage displays constant flow properties throughout the lot whereas the benzyldimethylamine catalyzed B-stages exhibits changing flow throughout the lot, ranging from excessive flow (dielectric too thin) to minimal flow (dielectric too thick).

The above description will be appreciated by those skilled in the art as illustrative of a class of curing systems, varnishes and prepregs for fire-resistant laminates possessing excellent physical and electrical properties. The method of their preparation is simple and may be carried out in conventional apparatus. All obvious variations in light of the above specific teachings are within the full intended scope of the appended claims.

I claim:

1. An epoxy resin composition for preparing storage-stable prepregs and multi-layer bonding sheets adapted to produce flame retardant laminates, said composition comprising
   (a) an epoxy resin mixture of (i) from 70 to 90 parts of a brominated epoxy resin comprising the reaction product of tetrabromobisphenol-A and epichlorohydrin having an epoxide equivalent weight in the range of 370–430 and a bromine content in the range of 15–22% and (ii) from 10 to 30 parts of a tetrafunctional epoxy resin comprising the reaction product of tetra-bis(hydroxyphenyl)ethane having an epoxide equivalent weight in the range of 210–240;
   (b) an effective amount of dicyandiamide as a curing agent;
   (c) from about 0.01 to 1.0 parts per part of said dicyandiamide of a tetraalkylguanidine as a catalyst; and
   (d) a suitable solvent.

2. An epoxy resin composition as defined in claim 1 wherein said tetraalkylguanidine is tetramethylguanidine.

3. As an article of manufacture, a glass fabric impregnated with an epoxy resin composition comprising:
   (a) an epoxy resin mixture of (i) from 70 to 90 parts of a brominated epoxy resin comprising the reaction product of tetrabromobisphenol-A and epichlorohydrin having an epoxide equivalent weight in the range of 370–430 and a bromine content in the range of 15–22% and (ii) from 10 to 30 parts of a tetrafunctional epoxy resin comprising the reaction product of tetra-bis(hydroxyphenyl)ethane having an epoxide equivalent weight in the range of 210–240;
   (b) an effective amount of dicyandiamide as a curing agent;
   (c) from about 0.01 to 1.0 parts per part of said dicyandiamide of a tetraalkylguanidine as a catalyst.

4. An article of manufacture as defined in claim 3 wherein said tetraalkylguanidine is tetramethylguanidine.

* * * * *